(12) United States Patent
Nomura

(10) Patent No.: US 10,048,326 B2
(45) Date of Patent: Aug. 14, 2018

(54) ELECTRONIC DEVICE EQUIPPED WITH A MAGNETIC SENSOR, AND MAGNETIC SENSOR CONTROL METHOD FOR SAME

(71) Applicant: CASIO COMPUTER CO., LTD., Shibuya-ku, Tokyo (JP)

(72) Inventor: Keiichi Nomura, Yamanashi-ken (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 195 days.

(21) Appl. No.: 15/009,722

(22) Filed: Jan. 28, 2016

(65) Prior Publication Data

US 2016/0266214 A1 Sep. 15, 2016

(30) Foreign Application Priority Data

Mar. 9, 2015 (JP) .................................. 2015-045588

(51) Int. Cl.
*G01B 7/14* (2006.01)
*G01R 33/00* (2006.01)
*H02J 7/00* (2006.01)
*H01R 13/62* (2006.01)
*G06K 1/00* (2006.01)
*H02J 1/00* (2006.01)

(52) U.S. Cl.
CPC ........ *G01R 33/0023* (2013.01); *H02J 7/0042* (2013.01); *G06K 1/00* (2013.01); *G06K 2207/00* (2013.01); *H01R 13/6205* (2013.01); *H02J 1/00* (2013.01)

(58) Field of Classification Search
CPC ......... H02J 1/00; G06K 1/00; G06K 2207/00; G06F 1/00; G06F 2101/00
See application file for complete search history.

(56) References Cited

U.S. PATENT DOCUMENTS

| | | | | |
|---|---|---|---|---|
| 2010/0198440 A1* | 8/2010 | Fujitake | .............. | B60L 11/1816 701/22 |
| 2010/0293302 A1* | 11/2010 | Fujii | ................... | G06F 13/4081 710/16 |
| 2011/0156659 A1* | 6/2011 | Saeki | ....................... | G03B 7/26 320/138 |
| 2011/0279078 A1* | 11/2011 | Hara | ...................... | H02J 7/027 320/107 |
| 2013/0169215 A1* | 7/2013 | Sakai | .................... | H02J 7/0042 320/107 |
| 2014/0300321 A1* | 10/2014 | Kim | ...................... | H02J 7/0004 320/111 |
| 2015/0058642 A1* | 2/2015 | Okamoto | ................ | G06F 13/14 713/300 |
| 2015/0214763 A1* | 7/2015 | Kim | ...................... | H02J 7/0073 320/107 |

FOREIGN PATENT DOCUMENTS

JP 2007232415 A 9/2007

* cited by examiner

*Primary Examiner* — Jermele M Hollington
*Assistant Examiner* — Temilade Rhodes-Vivour
(74) *Attorney, Agent, or Firm* — Holtz, Holtz & Volek PC

(57) ABSTRACT

An electronic device equipped with a magnetic sensor which detects a magnetic field around the electronic device, a connector connection section to connect to a magnetic connector including a magnet which is positioned on one end side of a connection cable, and a CPU, in which the CPU controls to stop a measuring operation in the magnetic sensor when judged that the connector connection section is connected to the magnetic connector.

20 Claims, 8 Drawing Sheets

DETAIL OF IB SECTION

DETAIL OF VB SECTION

ELECTRONIC DEVICE EQUIPPED WITH A MAGNETIC SENSOR, AND MAGNETIC SENSOR CONTROL METHOD FOR SAME

CROSS-REFERENCE TO RELATED APPLICATION

This application is based upon and claims the benefit of priority from the prior Japanese Patent Application No. 2015-045588, filed Mar. 9, 2015, the entire contents of which are incorporated herein by reference.

BACKGROUND OF THE INVENTION

1. Field of the Invention

The present invention relates to an electronic device equipped with a magnetic sensor and a magnetic sensor control method for the electronic sensor.

2. Description of the Related Art

In recent years, highly-functional electronic devices are significantly prevalent, such as smartphones (high-functionality portable telephones), tablet terminals, and wearable devices, and many of these electronic devices are equipped with various sensors, such as an acceleration sensor, angular velocity (gyro) sensor, or magnetic sensor (for example, Japanese Patent Application Laid-Open (Kokai) Publication No. 2007-232415).

Also, many of these electronic devices have a structure where a device is driven and its internal battery is charged with predetermined electric power supplied from a commercial alternating-current power supply via a predetermined power supply cable, and data transmission and reception are performed by the device being connected to an external device via a predetermined communication cable. In recent years, a connection cable including a magnetic connector has been known which is capable of power supply and data transmission and reception by removably connecting a power supply cable or communication cable (hereinafter referred to as "connection cable") to a connection section of a device by using magnetic force.

SUMMARY OF THE INVENTION

In accordance with one aspect of the present invention, there is provided an electronic device comprising: a magnetic sensor which detects a magnetic field around the electronic device; a connector connection section to connect to a magnetic connector including a magnet which is positioned on one end side of a connection cable; and a CPU, wherein the CPU controls to stop a measuring operation in the magnetic sensor when judged that the connector connection section is connected to the magnetic connector.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereafter, embodiments of an electronic device equipped with a magnetic sensor and a magnetic sensor control method for the electronic device according to the present invention will be described in detail.

First Embodiment (Electronic Device)

Figure 1A:
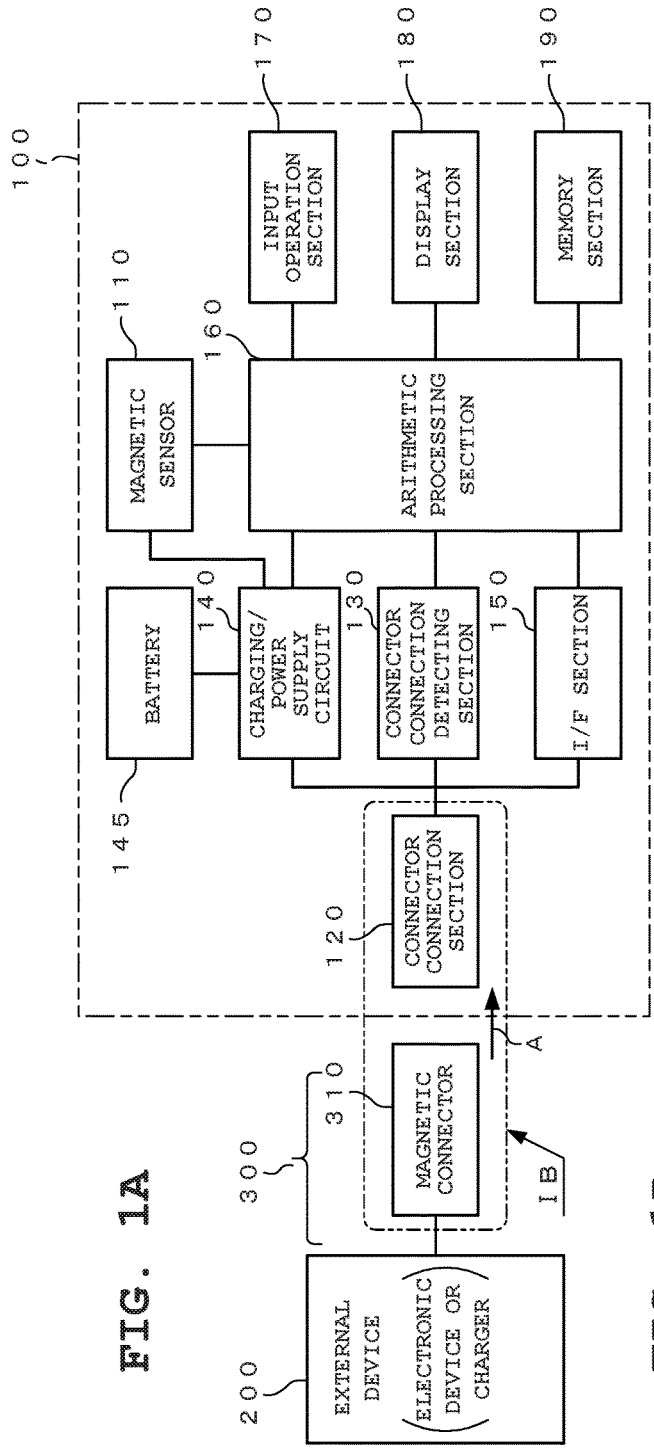
FIG. 1A is a schematic block diagram showing the entire structure of an electronic device according to a first embodiment of the present invention.
Figure 1B:
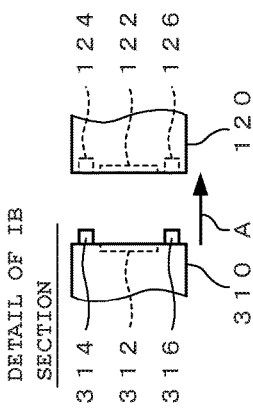
FIG. 1B is a detailed diagram showing the main structure of the electronic device according to the first embodiment of the present invention.
Figure 2:
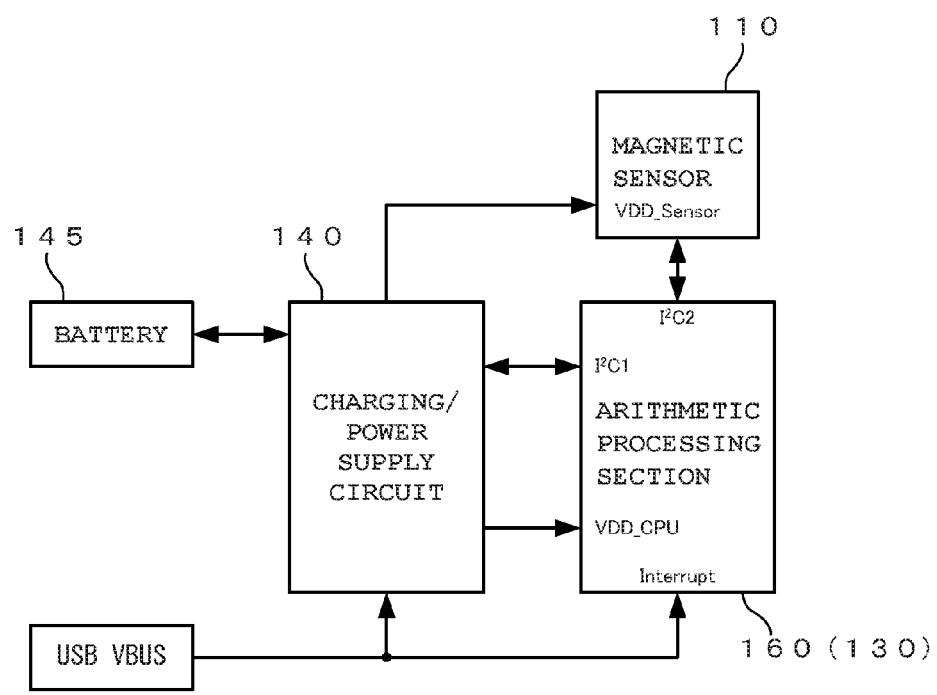
FIG. 2 is a detailed block diagram showing an example of the structure of the main portion of the electronic device according to the first embodiment.

FIG. 1A is a schematic block diagram showing the entire structure of an electronic device according to a first embodiment of the present invention, and FIG. 1B is a detailed diagram showing the main structure of the electronic device according to the first embodiment of the present invention. FIG. 2 is a detailed block diagram showing an example of the structure of the main portion of the electronic device according to the present embodiment.

An electronic device 100 according to the present embodiment is connected to an external device 200 constituted by another electronic device or a charger (or power-feeding power supply adaptor), for example, via a connection cable 300 including a magnetic connector 310, as depicted in FIG. 1A. This electronic device 100 includes, for example, a magnetic sensor 110, a connector connection section 120, a connector connection detecting section 130, a charging circuit and power supply circuit (hereinafter referred to as "charging/power supply circuit") 140, a battery 145, an interface section (hereinafter referred to as "I/F section") 150, an arithmetic processing section 160, an input operation section 170, a display section 180, and a memory section 190, as depicted in FIG. 1A. Here, the connector connection detecting section 130, the charging/power supply circuit 140, and the arithmetic processing section 160 correspond to a sensor control section according to the present invention.

The magnetic sensor 110 performs a measuring operation for detecting the magnetic field of the earth (magnitude and direction of the magnetic field) based on driving electric power (drive power VDD_Sensor) supplied from the charging/power supply circuit 140 described later, and outputs a detection signal to the arithmetic processing section 160, as depicted in FIG. 1A, FIG. 1B, and FIG. 2. The detection signal outputted from the magnetic sensor 110 is used for processing by the arithmetic processing section 160 to calculate an azimuth with reference to the electronic device 100. Here, the magnetic sensor 110 and the arithmetic processing section 160 are connected to each other via a synchronous serial interface ($I^2C2$ in the drawing) such as $I^2C$ (Inter-Integrated Circuit), and the arithmetic processing section 160 receives the detection signal from the magnetic sensor 110 in synchronization with the magnetic sensor 110, as depicted in FIG. 2.

Note that the sensor provided in the electronic device 100 is not limited to the magnetic sensor 110 described above. The electronic device 100 may further include various sensors, such as an acceleration sensor and angular velocity sensor (gyro sensor) which detect force applied to the electronic device 100, the direction of the force, and the like, and a positioning sensor using GPS (Global Positioning System) for acquiring geographic position information based on latitude and longitude information.

The connector connection detecting section 130 detects an electric connection status between the electronic device 100 and the external device 200. Specifically, the magnetic connector 310 included in the connection cable 300 is connected to the connector connection section 120 as indicated by arrow A in the drawing, and the connector connection detecting section 130 detects a bus voltage VBUS supplied from the external device 200 to the electronic device 100, whereby a detection signal is outputted to the arithmetic processing section 160. Here, when the external device 200 is a charger (or a power-feeding power supply adaptor), the bus voltage VBUS is supplied to the electronic device 100 as a charging voltage (or power-feeding voltage; VBUS and GND). When the external device 200 is another electronic device, the bus voltage VBUS is supplied by being superimposed on data or the like transmitted and received between the electronic device 100 and the external device 200. Note that the connector connection detecting section 130 may be incorporated, for example, as part of functions of the arithmetic processing section 160 described later, as depicted in FIG. 2. In this case, the arithmetic processing section 160 receives the bus voltage VBUS supplied via the connector connection section 120 as an interrupt signal.

The charging/power supply circuit 140 performs an operation by which the battery 145 constituted by a secondary battery such as a lithium-ion battery is charged with the charging voltage (or power-feeding voltage; VBUS and GND) supplied from the external device 200 or the bus voltage VBUS supplied by being superimposed at the time of data transmission or reception, and performs an operation of supplying driving electric power to each section of the electronic device 100. Also, based on a control signal from the arithmetic processing section 160 described later, the charging/power supply circuit 140 supplies or cuts driving electric power (driving voltage VDD_Sensor) from the battery 145 or the external device 200 to the magnetic sensor 110, and thereby controls the operation status of the magnetic sensor 110. Here, the charging/power supply circuit 140 and the arithmetic processing section 160 are connected to each other via a synchronous serial interface ($I^2C1$ in the drawing) such as $I^2C$, and the arithmetic processing section 160 transmits a control signal to the charging/power supply circuit 140 in synchronization with the charging/power supply circuit 140, as depicted in FIG. 2.

When the external device 200 is another electronic device, the I/F section 150 performs data transmission and reception or the like based on a control signal from the arithmetic processing section 160 described later. That is, the I/F section 150 transmits data or the like stored in the memory section 190 to the external device 200 via the connector connection section 120 and the connection cable 300, and stores data or the like received from the external device 200 in a predetermined storage area of the memory section 190.

The arithmetic processing section 160 is an arithmetic processing device such as a CPU (Central Processing Unit) or MPU (Micro Processing Unit), and executes a predetermined program based on driving electric power (driving voltage VDD_CPU) supplied from the charging/power supply circuit 140. As a result, the arithmetic processing section 160 controls various operations, such as a measuring operation and calibration processing in the magnetic sensor 110, an operation of calculating an azimuth with reference to the electronic device 100, a power supply operation in the charging/power supply circuit 140, and an information display operation on the display section 180. Also, the arithmetic processing section 160 performs a sensor control operation of judging the connection status of the magnetic connector 310 to the connector connection section 120 based on a detection signal from the connector connection detecting section 130, and controlling the operation status of the magnetic sensor 110. Note that a series of control operations including sensor control in the arithmetic processing section 160 is described in detail later.

The input operation section 170, for example, has an operation switch provided on the housing of the electronic device 100, a touch panel provided on the front surface (view field side) of the display section 180 described later, and the like. This input operation section 170 is used for various input operations such as an ON/OFF operation for the operation power supply of the electronic device 100 and a specific function, an operation for application software, and a setting operation for items to be displayed on the display section 180.

The display section 180, for example, has a display panel of a liquid-crystal type or light-emitting-element type, and displays position information and cartographic information including an azimuth calculated based on a detection signal outputted from the magnetic sensor 110 described above, information regarding the charging status of the battery and the status of connection with the external device 200 including the status of transmission and reception of data or the like, and any other information desired by the user.

The memory section 190 stores in a predetermined storage area a detection signal outputted from the above-described magnetic sensor 110 in association with time data. Also, the memory section 190 stores various data generated by a processing operation (including sensor control operation) performed in the arithmetic processing section 160. Moreover, the memory section 190 stores control programs for operations in the respective sections such as the magnetic sensor 110, the charging/power supply circuit 140, and the display section 180, and algorithm programs for performing predetermined sensor control operations based on detection signals from the connector connection detecting section 130. Note that these programs may be incorporated in advance in the arithmetic processing section 160. In addition, the memory section 190 may be partially or entirely in a form of a removable storage medium such as a memory card, and may be structured to be removable from the electronic device 100.

The connection cable 300 for connecting the electronic device 100 according to the present embodiment and the external device 200 has the magnetic connector 310 provided on at least one end to be connected to the electronic device 100. The magnetic connector 310, for example, has a magnet 312 and electrodes 314 and 316, as depicted in FIG. 1B. On the other hand, the connector connection section 120 of the electronic device 100 has a magnetic body (ferromagnetic body) 122 made of iron, cobalt, nickel, or an alloy thereof, a ferrite, and electrodes 124 and 126. Here, the magnet 312 of the magnetic connector 310 and the magnetic body 122 of the connector connection section 120 are arranged opposing each other. When the magnetic connector 310 is brought closer to the connector connection section 120 in the direction indicated by arrow A with the magnet 312 of the magnetic connector 310 and the magnetic body 122 of the connector connection section 120 opposing each other, these magnet 312 and magnetic body 122 are attached to each other by a moderate magnetic force (force not allowing easy detachment), which causes the magnetic connector 310 and the connector connection section 120 to be physically connected to each other. The electrodes 314 and 316 of the magnetic connector 310 and the electrodes 124 and 126 of the connector connection section 120 are provided opposing each other in a one-to-one relation. The electrode 314 and the electrode 124 come in contact with each other and the electrode 316 and the electrode 126 come in contact with each other with the magnet 312 and the magnetic body 122 being attached to each other by magnetic force and the magnetic connector 310 and the connector connection section 120 being physically connected to each other, whereby the magnetic connector 310 and the connector connection section 120 are electrically connected to each other. As a result, the bus voltage VBUS is supplied from the external device 200 to the electronic device 100 via the connection cable 300.

In FIG. 1B, the structure has been described in which the magnetic connector 310 and the connector connection section 120 are electrically connected to each other by two electrodes. However, the present invention is not limited thereto. For example, a structure may be adopted in which the magnetic connector 310 and the connector connection section 120 are electrically connected to each other by three or more electrodes, as in a case where data or the like is transmitted and received by a specific communication standard such as USB (Universal Serial Bus). Also, the other end (an end on an external device 200 side) of the connection cable 300, for example, may be integrally connected to the external device 200, or may be removably connected to the external device 200 via a connection terminal 330 meeting a specific standard such as USB, as will be described further below (refer to FIG. 8A and FIG. 8B).

(Control Method for Electronic Device)

Next, a control method (magnetic sensor control method) for the electronic device according to the present embodiment is described with reference to the drawings. Here, the following control method for the electronic device is achieved by the above-described arithmetic processing section 160 performing processing by following a predetermined control program and algorithm program.

Figure 3:
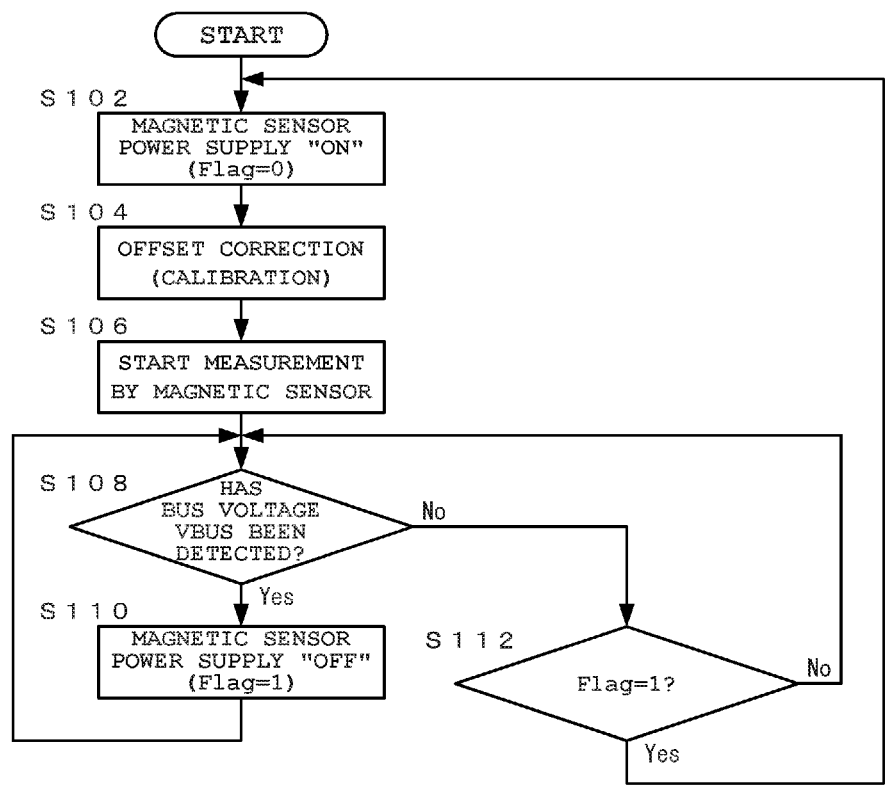
FIG. 3 is a flowchart of an example of a control method for the electronic device according to the first embodiment.

FIG. 3 is a flowchart of an example of the control method for the electronic device according to the present embodiment.

In the control method for the electronic device 100 according to the present embodiment, first, a user turns on a power supply switch of the input operation section 170, and thereby activates the electronic device 100, as depicted in the flowchart of FIG. 3. Specifically, driving electric power (drive voltage VDD_CPU) is supplied from the battery 145 to the arithmetic processing section 160 to execute a predetermined program. Also, based on a control signal from the arithmetic processing section 160, driving electric power is supplied by the charging/power supply circuit 140 from the battery 145 to each section including the magnetic sensor 110. Here, drive voltage VDD_Sensor is supplied to the magnetic sensor 110 as driving electric power so as to drive the magnetic sensor 110 (power supply "ON") (Step S102). Here, immediately after the electronic device 100 is activated, the arithmetic processing section 160 sets a flag defining the operation status of the magnetic sensor 110 at "0" as an initial value, and stores the flag in a predetermine storage area of the memory section 190.

Next, the arithmetic processing section 160 performs calibration processing for correcting an error (offset) due to an external magnetic field in an azimuth calculated based on a detection signal outputted from the magnetic sensor 110 (Step S104). Note that a method of the calibration processing is not limited to a particular method, and any known method related thereto can be used. For example, as a method of the calibration processing, a method can be used in which the user swings the electronic device 100 (makes a swiveling movement) such that the electronic device 100 draws a specific path (for example, a figure of eight) on a horizontal plane with respect to a ground plane, and thereby causes the arithmetic processing section 160 to calculate an offset correction value based on a detection signal outputted from the magnetic sensor 110. Also, as another method of the calibration processing, a method can be used in which the arithmetic processing section 160 performs known arithmetic processing based on detection signals in triaxial directions detected by the magnetic sensor 110 (without the user swinging the electronic device 100), and thereby automatically calculates an offset correction value. The offset correction value calculated by the calibration processing is stored in a predetermined storage area of the memory section 190.

Next, the arithmetic processing section 160 causes an operation of measuring a magnetic field (sensing operation) to be started by the magnetic sensor 110 (Step S106), associates detection signals sequentially outputted from the magnetic sensor 110 with time data, and stores the resultant data as magnetic data in a predetermined storage area of the memory section 190. Here, the measuring operation by the magnetic sensor 110 may be performed constantly (or may be substantially continuously performed at very short time intervals), or may be performed intermittently at relatively long time intervals. Then, the arithmetic processing section 160 uses the magnetic data stored in the memory section 190 to perform predetermined arithmetic processing, and thereby calculates an azimuth with reference to the electronic device 100. The calculated azimuth is displayed on the display section 180 in combination with, for example, position information, cartographic information, and the like.

Next, the arithmetic processing section 160 detects whether the bus voltage VBUS has been supplied from the external device 200 (Step S108). Specifically, the magnetic connector 310 provided to the connection cable 300 is connected to the connector connection section 120, and the connector connection detecting section 130 detects the bus voltage VBUS supplied from the external device 200 to the electronic device 100, whereby a detection signal is outputted to the arithmetic processing section 160. Subsequently, based on the presence or absence of this detection signal, the arithmetic processing section 160 judges the status of connection between the electronic device 100 and the external device 200.

Then, when the connector connection detecting section 130 detects the bus voltage VBUS (Yes at Step S108), the arithmetic processing section 160 judges that the magnetic connector 310 has been connected to the connector connection section 120. Then, the arithmetic processing section 160 performs control to output a control signal to the charging/power supply circuit 140 and cut the supply (power supply "OFF") of driving electric power (drive voltage VDD_Sensor) from the battery 145 or the external device 200 to the magnetic sensor 110 (Step S110). As a result, all operations including the measuring operation by the magnetic sensor 110 are suspended. Here, the arithmetic processing section 160 resets the flag defining the operation status of the magnetic sensor 110 at "1", and stores (that is, updates) it in the memory section 190. Note that, at Step S110, the arithmetic processing section 160 performs control such that, even when the supply of driving electric power to the magnetic sensor 110 is cut, predetermined driving electric power is supplied by the charging/power supply circuit 140 from the battery 145 or the external device 200 to each of the sections of the electronic device 100 excluding the magnetic sensor 110. Then, the arithmetic processing section 160 returns to Step S108 to repeatedly perform the processing operations at Steps S108 to S110 described above until the bus voltage VBUS supplied from the external device 200 is not detected by the connector connection detecting section 130.

At Step S108, when the bus voltage VBUS is not detected or is no longer detected by the connector connection detecting section 130 (No at Step S108), the arithmetic processing section 160 judges that the magnetic connector 310 has not been connected to the connector connection section 120 or has been detached from the connector connection section 120. Subsequently, the arithmetic processing section 160 judges whether the flag defining the operation status of the magnetic sensor 110 is indicating "1" (Step S112). Specifically, the arithmetic processing section 160 reads out the flag defining the operation status of the magnetic sensor 110 stored in the memory section 190, and judges whether the flag has been set at "1" and the supply of driving electric power to the magnetic sensor 110 has been cut (power supply "OFF") at Step S110 described above.

Then, when judged that the flag has not been set at "1" and driving electric power has been supplied to the magnetic sensor 110 (No at Step S112), the arithmetic processing section 160 returns to Step S108 to repeat the processing operations at Steps S108 and S112 described above and cause the measuring operation by the magnetic sensor 110 to be continued until the bus voltage VBUS is detected.

Conversely, when judged that the flag has been set at "1" and driving electric power to the magnetic sensor 110 has not been cut (Yes at Step S112), the arithmetic processing section 160 returns to Step S102, supplies driving electric power to the magnetic sensor 110 (power supply "ON") again to drive it, resets the flag at "0", and repeatedly performs the processing operations at Steps S102 to S112 described above.

Note that, although omitted in the flowchart of FIG. 3, the arithmetic processing section 160 constantly or regularly monitors for an input operation for cutting or ending a control operation and a change in the operation status while the series of sensor control operations is being performed and, when an input operation or a status change is detected, forcibly ends the sensor control operation. Specifically, the arithmetic processing section 160 detects a power off operation on the power supply switch by the user, a decrease in the battery remaining amounts of the charging/power supply circuit 140 and the battery 145, anomaly in a function or an application being executed, and the like, and then forcibly stops and ends the series of sensor control operations.

As described above, in the electronic device 100 equipped with the magnetic sensor 110 in the present embodiment, in a case where the battery 145 is charged or data or the like is transmitted or received via the connection cable 300 having the magnetic connector 310, a predetermined voltage (bus voltage VBUS) supplied from the external device 200 is detected, whereby the status of the connection of the magnetic connector 310 to the electronic device 100 is judged. Subsequently, when a judgment is made that the magnetic connector 310 has been connected to the electronic device 100 and the predetermined voltage (bus voltage VBUS) has been supplied from the external device 200, the supply of driving electric power (drive voltage VDD_Sensor) to the external device 200 is cut (power supply "OFF"), and all operations including a measuring operation by the magnetic sensor 110 are stopped. Then, when the magnetic connector 310 is detached from the electronic device 100 and the predetermined voltage (bus voltage VBUS) supplied from the magnetic sensor 110 is cut, the supply of the driving electric power (drive voltage VDD_Sensor) to the magnetic sensor 110 is restarted (power supply "ON"), and calibration processing and a measuring operation are performed by the magnetic sensor 110.

That is, in some cases, in a state where the magnetic connector 310 has been connected to the electronic device 100, a magnetic field generated from the magnet provided to the magnetic connector 310 may affect the magnetic sensor 110 provided to the electronic device 100 and make correct azimuth detection impossible. In the present embodiment, during a period where a predetermined voltage is supplied from the external device 200 (that is, the magnetic connector 310 has been connected to the electronic device 100), control is performed such that the power supply of the magnetic sensor 110 is turned "OFF" to disable unnecessary operations such as a measuring operation. As a result, erroneous azimuth detection during power feeding to the electronic device and data transmission and reception can be prevented. In addition, power consumption in the magnetic sensor 110 can be reduced, whereby power consumption in the electronic device 100 can be suppressed.

Modification Example

Next, a modification example of the control method for the electronic device according to the present embodiment is described.

Figure 4:
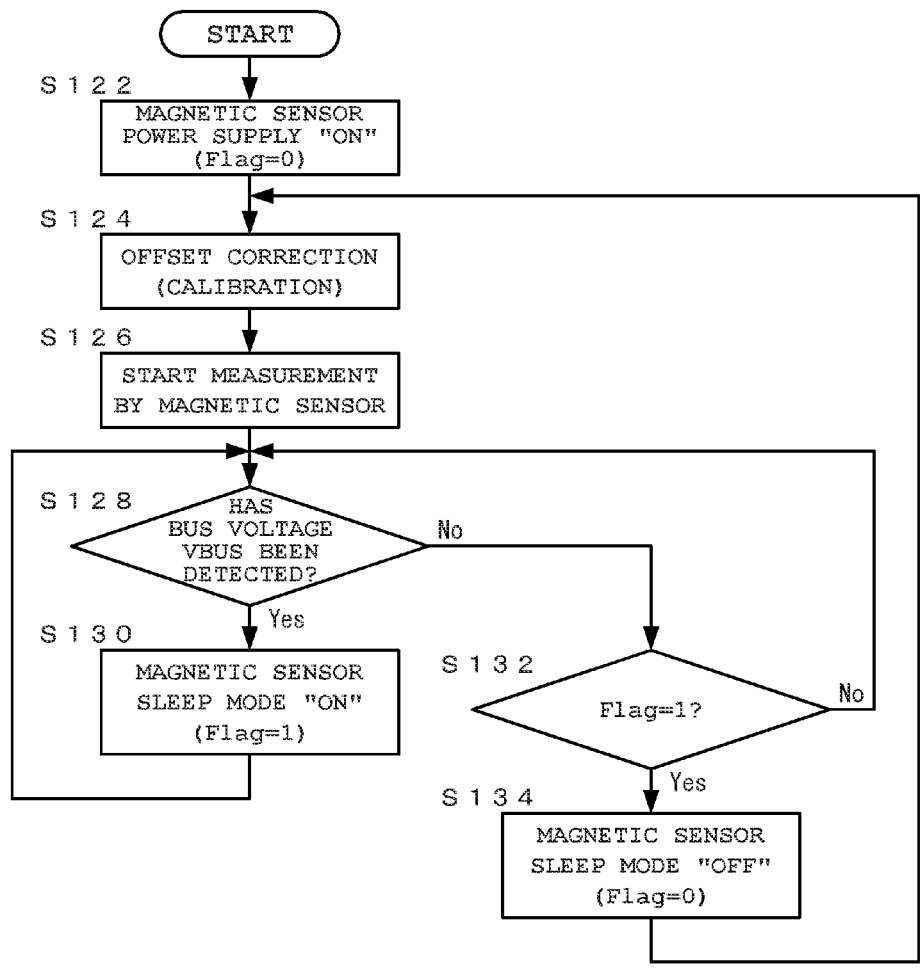
FIG. 4 is a flowchart of a modification example of the control method in the electronic device according to the first embodiment.

FIG. 4 is a flowchart of the modification example of the control method for the electronic device according to the present embodiment. Note that processing operations equivalent to those of the first embodiment are provided with the same reference numerals and descriptions thereof are simplified.

In the sensor control method for the electronic device 100 according to the modification example, first, the electronic device 100 is activated, and driving electric power (drive voltage VDD_Sensor) is supplied to the magnetic sensor 110, whereby the magnetic sensor 110 is driven (power supply "ON"), as depicted in the flowchart of FIG. 4 (Step S122). Here, immediately after the electronic device 100 is activated, the arithmetic processing section 160 causes the magnetic sensor 110 to operate in a normal mode, and sets a flag defining the operation status at "0" as an initial value. Then, the arithmetic processing section 160 performs calibration processing by the magnetic sensor 110 (Step S124), and then starts a magnetic field measuring operation by the magnetic sensor 110 (Step S126).

Next, when the magnetic connector 310 provided to the connection cable 300 is connected to the connector connection section 120, and the arithmetic processing section 160 detects based on a detection signal from the connector connection detecting section 130 that the bus voltage VBUS has been supplied from the external device 200 (Yes at Step S128), the arithmetic processing section 160 performs control to output a control signal to the magnetic sensor 110 and cause the magnetic sensor 110 to enter a sleep mode that is a power-power saving mode where the measuring operation is stopped and minimum electric power is supplied (Sleep mode "ON") (Step S130). As a result, at least the measuring operation in the magnetic sensor 110 is stopped. Here, the arithmetic processing section 160 resets (updates) the flag defining the operation status of the magnetic sensor 110 in the sleep mode at "1". Then, the arithmetic processing section 160 returns to Step S128 to repeatedly perform the processing operations at Steps S128 to S130 described above until the bus voltage VBUS is no longer detected by the connector connection detecting section 130.

On the other hand, when the magnetic connector 310 has not been connected to the connector connection section 120 or has been detached from the connector connection section 120 and the bus voltage VBUS is not detected or is no longer detected by the connector connection detecting section 130 (No at Step S128), the arithmetic processing section 160 judges whether the flag defining the operation status of the magnetic sensor 110 indicates "1" (Step S132). That is, the arithmetic processing section 160 judges whether the flag has been set at "1" at Step S130 to cause the magnetic sensor 110 to be set in the sleep mode (Sleep mode "ON").

When judged that the flag has not been set at "1" and the magnetic sensor 110 has not been set in the sleep mode (No at Step 132), the arithmetic processing section 160 returns to Step S128 to repeat the processing operations at Steps S128 and S132 described above and cause the measuring operation to be continued in the magnetic sensor 110 until the bus voltage VBUS is detected. Conversely, when the flag has been set at "1" and the magnetic sensor 110 has been set in the sleep mode (Yes at Step 132), the arithmetic processing section 160 performs control to output a control signal to the magnetic sensor 110 and thereby cancel the sleep mode (Sleep mode "OFF") so as to cause the magnetic sensor 110 to operate in the normal mode (Step S134), and also resets the flag at "0". Then, the arithmetic processing section 160 returns to Step S124 to cause the magnetic sensor 110 to perform calibration processing and a measuring operation again, and repeatedly performs the processing operations at Step S124 to S134 described above.

In this flowchart of FIG. 4 as well, the arithmetic processing section 160 constantly or regularly monitors for an input operation for cutting or ending a control operation and a change in the operation status while the series of sensor control operations is being performed and, when an input operation or a status change is detected, forcibly ends the sensor control operation, as with the first embodiment.

As described above, in the modification example, a predetermined voltage (bus voltage VBUS) supplied from the external device 200 is detected by using a method similar to that of the above-described first embodiment, whereby the status of the connection of the magnetic connector 310 to the electronic device 100 is judged. Subsequently, when a judgment is made that the magnetic connector 310 has been connected to the electronic device 100 and the predetermined voltage (bus voltage VBUS) has been supplied from the external device 200, the magnetic sensor 110 enters the sleep mode that is a power-saving mode (Sleep mode "ON"), whereby at least a measuring operation by the magnetic sensor 110 is stopped. Then, when the magnetic connector 310 is detached from the electronic device 100 and the predetermined voltage (bus voltage VBUS) supplied from the external device 200 is cut, the magnetic sensor 110 reverts to the normal mode from the sleep mode (Sleep mode "OFF") and restarts calibration processing and the measuring operation.

According to the modification example, during a period where a predetermined voltage is supplied from the external device 200, the magnetic sensor 110 enters the sleep mode so as not to perform unnecessary operations, whereby power consumption can be suppressed and erroneous azimuth detection due to a magnetic field generated from the magnet provided in the magnetic connector 310 can be prevented, as with the above-described first embodiment. Also, when the predetermined voltage supplied from the external device 200 is cut (that is, the magnetic connector 310 is detached from the electronic device 100), the magnetic sensor 110 enters the normal mode from the sleep mode, so that calibration processing and a measuring operation in the magnetic sensor 110 can be quickly restarted, whereby correct azimuth detection can be quickly achieved.

Second Embodiment

Next, a second embodiment of the electronic device according to the present invention is described with reference to the drawings. Note that sections and processing operations similar to those of the first embodiment are only briefly described.

In the configuration of the above-described first embodiment, a state where the magnetic connector 310 has been connected to the connector connection section 120 is detected by the connector connection detecting section 130 detecting the bus voltage VBUS supplied from the external device 200 via the connection cable 300. However, in the configuration of the second embodiment, a state where the magnetic connector 310 has been physically connected to the connector connection section 120 is directly detected.

(Electronic Device)

Figure 5A:
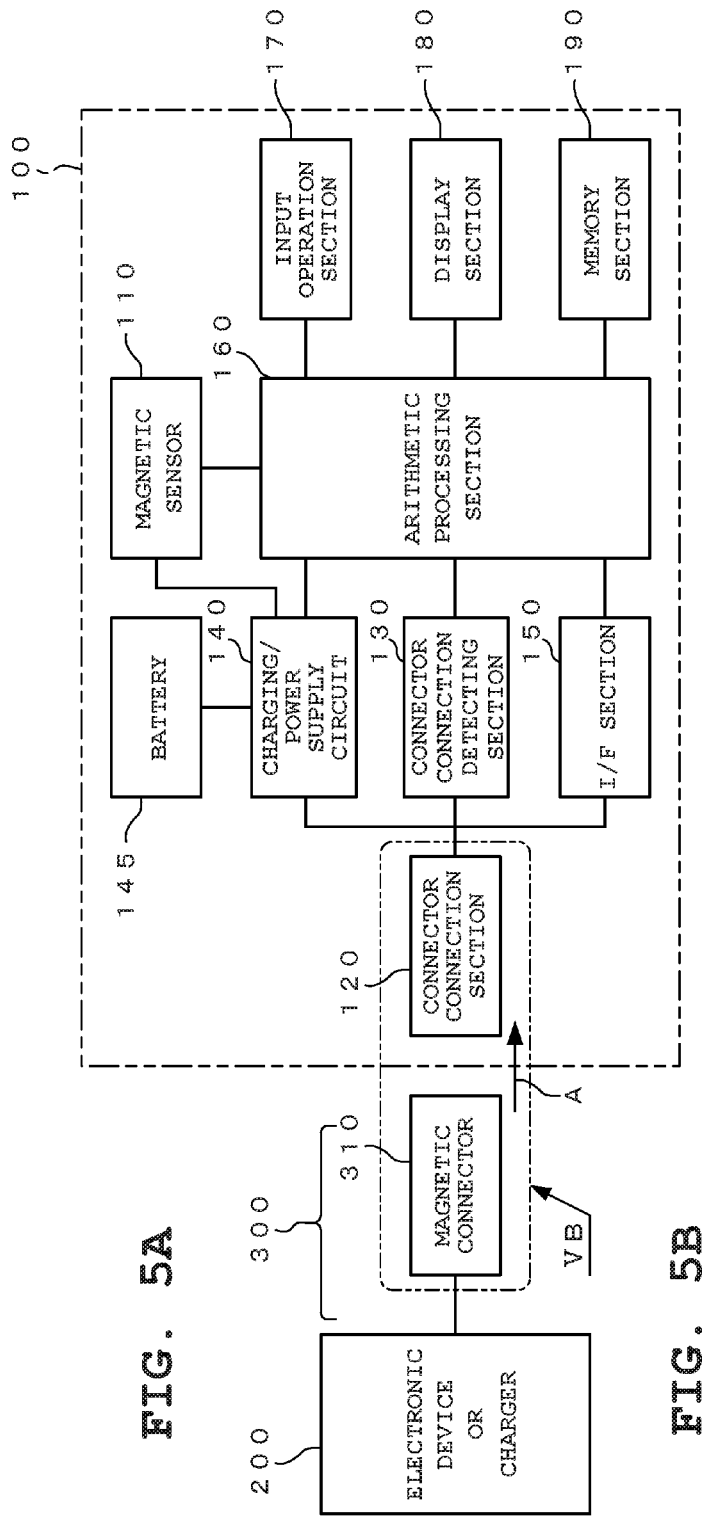
FIG. 5A is a schematic block diagram showing the entire structure of an electronic device according to a second embodiment of the present invention.
Figure 5B:
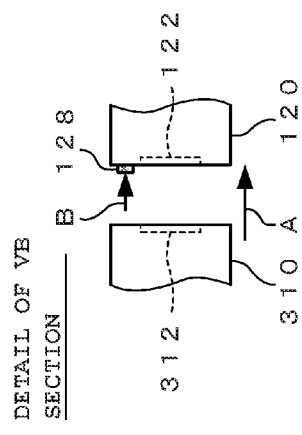
FIG. 5B is a detailed diagram showing the main structure of the electronic device according to the second embodiment of the present invention.

FIG. 5A is a schematic block diagram showing the entire structure of the electronic device according to the second embodiment, and FIG. 5B is a detailed diagram showing the main structure of the electronic device according to the second embodiment.

The electronic device 100 according to the present embodiment has a structure equivalent to that of the above-described first embodiment except that the connector connection section 120 includes a mechanical switch 128 for detecting a state where the magnetic connector 310 provided to the connection cable 300 has been physically connected. The mechanical switch 128, for example, is a mechanical-type switch such as a push button. When the magnetic connector 310 is attached to the magnetic body 122 of the connector connection section 120 by magnetic force of the magnet 312 as indicated by arrow A in the drawings to cause the magnetic connector 310 and the connector connection section 120 to be physically connected to each other, the mechanical switch 128 is pressed or turned ON as indicated by arrow B in the drawing, and outputs a switch signal at this timing.

The connector connection detecting section 130 outputs a detection signal by the magnetic connector 310 being electrically connected to the connector connection section 120 and the bus voltage VBUS supplied from the external device 200 to the electronic device 100 being detected, as with the above-described first embodiment.

The arithmetic processing section 160 performs a sensor control operation of judging the status of the physical and electrical connection of the magnetic connector 310 to the connector connection section 120 and controlling the operation status of the magnetic sensor 110, based on the switch signal outputted from the connector connection section 120 and the detection signal outputted from the connector connection detecting section 130.

(Control Method for Electronic Device)

Next, the control method (magnetic sensor control method) for the electronic device 100 according to the present embodiment is described. The control method for the electronic device in this embodiment is also achieved by the arithmetic processing section 160 performing processing in accordance with a predetermined control program and algorithm program.

Figure 6:
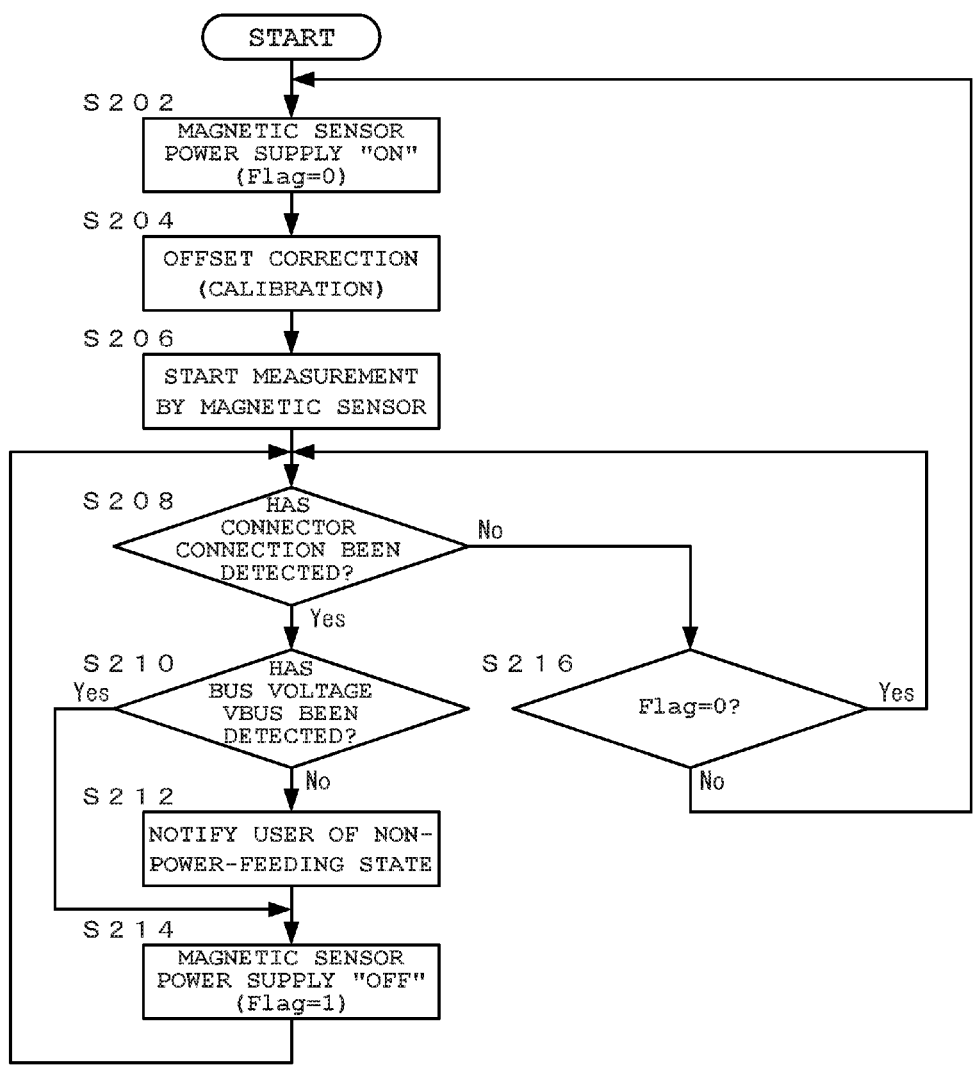
FIG. 6 is a flowchart of an example of a control method for the electronic device according to the second embodiment.

FIG. 6 is a flowchart of an example of the control method for the electronic device according to the second embodiment.

In the sensor control method for the electronic device 100 according to the present embodiment, as with Steps S102 to S106 described in the first embodiment, the arithmetic processing section 160 first supplies driving electric power to the magnetic sensor 110 in response to the activation of the electronic device 100, and thereby drives the magnetic sensor 110 (power supply "ON" and flag "0"), as depicted in the flowchart of FIG. 6 (Step S202). Subsequently, the arithmetic processing section 160 performs calibration processing in the magnetic sensor 110 (Step S204), and starts a magnetic field measuring operation by the magnetic sensor 110 (Step S206).

Next, the arithmetic processing section 160 judges whether the magnetic connector 310 provided to the connection cable 300 has been connected to the connector connection section 120 (Step S208). Specifically, based on a switch signal outputted from the connector connection section 120 by the magnetic connector 310 provided to the connection cable 300 being connected to the connector connection section 120 and the mechanical switch 128 being pressed or turned ON, the arithmetic processing section 160 judges the status of a physical connection between the magnetic connector 310 and the connector connection section 120.

Then, when judged based on the switch signal outputted from the connector connection section 120 that the magnetic connector 310 has been connected to the connector connection section 120, (Yes at Step S208), the arithmetic processing section 160 detects whether the bus voltage VBUS has been supplied from the external device 200 (Step S210). That is, the arithmetic processing section 160 judges the status of an electrical connection between the electronic device 100 and the external device 200 based on a detection signal outputted from the connector connection detecting section 130 by the bus voltage VBUS supplied from the external device 200 being detected.

Then, when the bus voltage VBUS is detected by the connector connection detecting section 130 (Yes at Step S210), the arithmetic processing section 160 performs control to output a control signal to the charging/power supply circuit 140 so as to cut the supply of driving electric power to the magnetic sensor 110 (power supply "OFF" and flag "1") (Step S214).

Conversely, when the bus voltage VBUS is not detected or is no longer detected by the connector connection detecting section 130 (No at Step S210), the arithmetic processing section 160 judges that the magnetic connector 310 and the connector connection section 120 have been physically connected to each other but the bus voltage VBUS has not been supplied from the external device 200. Accordingly, the arithmetic processing section 160 causes the display section 180 to display information indicating that power is not being fed from the external device 200 and the connection cable 300 may have been detached from the external device 200 or the power supply of the external device 200 may have been turned OFF, so as to give a notification regarding this to the user (Step S212). For example, in a situation where the magnetic connector 310 has been connected to the connector connection section 120 to charge the battery 145, the notification indicates a (non-charging) state where the battery 145 has not been charged although it is supposed to be charged. In a situation where data communication is to be performed between the external device 200 and the electronic device 100, the notification indicates a state where communication has not been performed although it is supposed to be performed. In the present embodiment, the user can be notified of this state, which prevents troubles and improves user convenience. Then, the arithmetic processing section 160 performs control to output a control signal to the charging/power supply circuit 140 so as to cut the supply of driving electric power to the magnetic sensor 110 (power supply "OFF" and flag "1") (Step S214).

After Step S214, the arithmetic processing section 160 returns to Step S208 to repeatedly perform the processing operations at Step S208 to S214 described above until a judgment is made that the magnetic connector 310 has not been connected to the connector connection section 120 or has been detached from the connector connection section 120.

At Step S208, when the connection of the magnetic connector 310 to the connector connection section 120 is not detected or is no longer detected (No at Step S208), the arithmetic processing section 160 judges whether the flag defining the operation status of the magnetic sensor 110 indicates "0" (Step S216). That is, the arithmetic processing section 160 judges whether driving electric power to the magnetic sensor 110 has been supplied (power supply "ON").

When judged that the flag has been set at "0" and the driving electric power has been supplied to the magnetic sensor 110 (Yes at Step S216), the arithmetic processing section 160 returns to Step S208 to repeat the processing operations at Steps 208 to S216 described above, and causes the measuring operation to be continued in the magnetic sensor 110 until the connection of the magnetic connector 310 to the connector connection section 120 is detected.

Conversely, when judged that the flag has not been set at "0" and driving electric power to the magnetic sensor 110 has been cut (No at Step S216), the arithmetic processing section 160 returns to Step S202 to supply driving electric power to the magnetic sensor 110 for driving it again (power supply "ON" and flag "0") and repeatedly perform the above-described processing operations at Steps S202 to S216.

As described above, in the present embodiment, when the magnetic connector 310 of the connection cable 300 has been physically connected to the electronic device 100, driving electric power to the magnetic sensor 110 is cut (power supply "OFF"). When the magnetic connector 310 of the connection cable 300 has been connected to the electronic device 100 but the bus voltage VBUS has not been supplied from the external device 200, the user is notified of the status of the charging of the battery 145 and the status of power feeding from the external device 200. Then, when the magnetic connector 310 is detached from the electronic device 100, the supply of driving electric power (drive voltage VDD_Sensor) to the magnetic sensor 110 is restarted (power supply "ON"), and calibration processing and a measuring operation in the magnetic sensor 110 is performed.

According to the present embodiment, during a period where the magnetic connector 310 is connected to the electronic device 100, the power supply of the magnetic sensor 110 is turned "OFF", so that unnecessary operations can be stopped, whereby power consumption can be suppressed and erroneous azimuth detection due to a magnetic field generated from the magnet provided to the magnetic connector 310 can be prevented. Also, when the magnetic connector 310 has been connected to the electronic device 100 but the predetermined voltage has not been supplied from the external device 200, it is possible to notify the user of the charging status and the power feeding status in the electronic device 100. That is, an electronic device that is excellent in usability can be provided.

Modification Example

Next, a modification example of the control method for the electronic device according to the present embodiment is described.

Figure 7:
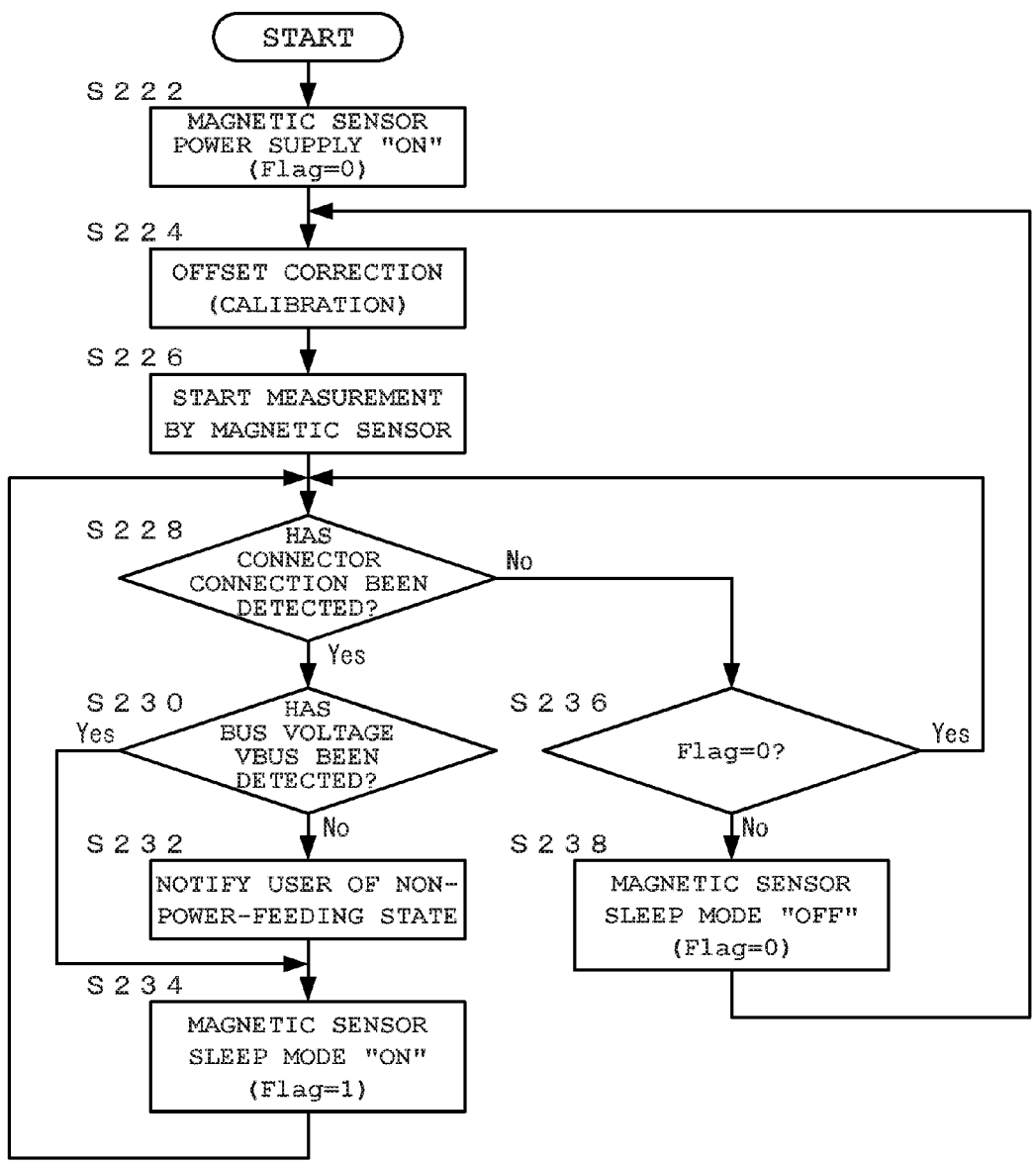
FIG. 7 is a flowchart of a modification example of the control method for the electronic device according to the second embodiment.

FIG. 7 is a flowchart of the modification example of the control method for the electronic device according to the present embodiment. Note that processing operations equivalent to those of the second embodiment are provided with the same reference numerals and descriptions thereof are simplified.

In the sensor control method for the electronic device 100 according to this modification example, as with Steps S122 to S126 described in the modification example of the first embodiment, the arithmetic processing section 160 first supplies driving electric power to the magnetic sensor 110 in response to the activation of the electronic device 100, and thereby drives the magnetic sensor 110 in a normal mode (power supply "ON" and flag "0"), as depicted in the flowchart of FIG. 7 (Step S222). Subsequently, the arithmetic processing section 160 performs calibration processing in the magnetic sensor 110 (Step S224), and starts a magnetic field measuring operation (Step S226).

Next, when it is detected based on a switch signal from the connector connection section 120 that the magnetic connector 310 provided to the connection cable 300 has been connected to the connector connection section 120 (Yes at Step S228), the arithmetic processing section 160 further detects whether the bus voltage VBUS has been supplied from the external device 200 (Step S230).

Then, when the bus voltage VBUS has been supplied from the external device 200 (Yes at Step S230), the arithmetic processing section 160 performs control to output a control signal to the magnetic sensor 110 and controls the magnetic sensor 110 to enter a sleep mode that is a power-saving mode (Sleep mode "ON" and flag "1") (Step S234) so as to stop at least the measuring operation in the magnetic sensor 110.

Conversely, when the bus voltage VBUS has not been supplied from the external device 200 (No at Step S230), the arithmetic processing section 160 judges that the magnetic connector 310 and the connector connection section 120 have been physically connected to each other but the bus voltage VBUS has not been supplied from the external device 200. Accordingly, the arithmetic processing section 160 causes the display section 180 to display information indicating that power is not being fed from the external device 200 and the connection cable 300 may have been detached from the external device 200 or the power supply of the external device 200 may have been turned OFF, so as to give a notification regarding this to the user (Step S232). Then, the arithmetic processing section 160 performs control to output a control signal to the magnetic sensor 110 and controls the magnetic sensor 110 to enter a sleep mode that is a power-saving mode (Sleep mode "ON" and flag "1") (Step S234) so as to stop at least the measuring operation in the magnetic sensor 110.

After Step S234, the arithmetic processing section 160 returns to Step S228 to repeatedly perform the above-described processing operation at Steps S228 to S234 until a judgment is made that the magnetic connector 310 has not been connected to the connector connection section 120.

At Step S228, when the connection of the magnetic connector 310 to the connector connection section 120 is not detected (No at Step S228), the arithmetic processing section 160 judges whether the flag defining the operation status of the magnetic sensor 110 indicates "0" (Step S236). That is, the arithmetic processing section 160 judges whether the magnetic sensor 110 has been set in the normal mode (Sleep mode "OFF").

When judged that the flag has been set at "0" and the magnetic sensor 110 has been set in the normal mode (Yes at Step S236), the arithmetic processing section 160 returns to Step S228 to repeat the above-described processing operations at Steps S228 to S236 and cause the measuring operation to be continued in the magnetic sensor 110 until the connection of the magnetic connector 310 to the connector connection section 120 is detected.

Conversely, when judged that the flag has not been set at "0" and the magnetic sensor 110 has been set in the sleep mode (No at Step S236), the arithmetic processing section 160 performs control to output a control signal to the magnetic sensor 110 to cancel the sleep mode (Sleep mode "OFF" and flag "0") and cause the magnetic sensor 110 to be operated in the normal mode (Step S238). Then, the arithmetic processing section 160 returns to Step S224 to cause the magnetic sensor 110 to perform the calibration processing and the measuring operation again, and repeatedly performs the above-described processing operations at Steps S224 to S238.

As described above, in the present modification example, the status of the connection of the magnetic connector 310 to the connector connection section 120 is directly detected by the mechanical switch 128 by use of a method similar to that of the above-described second embodiment, whereby the status of the physical connection of the magnetic connector 310 to the electronic device 100 is judged. When the magnetic connector 310 has been connected to the electronic device 100, the magnetic sensor 110 enters the sleep mode that is a power-saving mode (Sleep mode "ON"), so that at least a measuring operation in the magnetic sensor 110 is stopped. When the magnetic connector 310 has been detached from the electronic device 100, the magnetic sensor 110 reverts to the normal mode from the sleep mode (Sleep mode "OFF") and restarts calibration processing and the measuring operation.

According to this modification example, during a period in which the magnetic connector 310 is connected to the electronic device 100, the magnetic sensor 110 enters the sleep mode that is a power-saving mode so as not to perform unnecessary operations, whereby power consumption can be suppressed and erroneous azimuth detection due to a magnetic field generated from the magnet provided in the magnetic connector 310 can be prevented, as with the above-described second embodiment. Also, when the magnetic connector 310 is detached from the electronic device 100, the magnetic sensor 110 enters the normal mode from the sleep mode, so that calibration processing and a measuring operation in the magnetic sensor 110 can be quickly restarted, whereby correct azimuth detection can be quickly achieved.

Examples of Application

Next, examples of electronic devices to which the present invention can be applied are described with reference to the drawings.

Figure 8A:
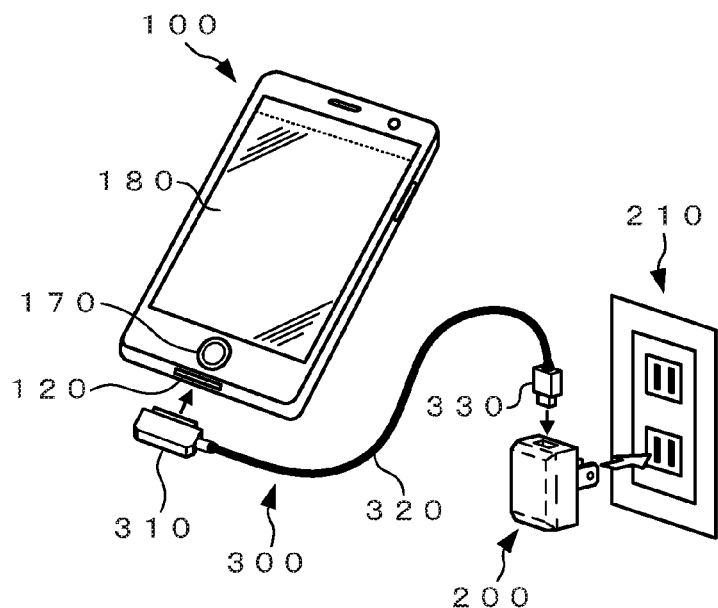
FIG. 8A is a schematic perspective view showing an application example of the electronic device according to the present invention.
Figure 8B:
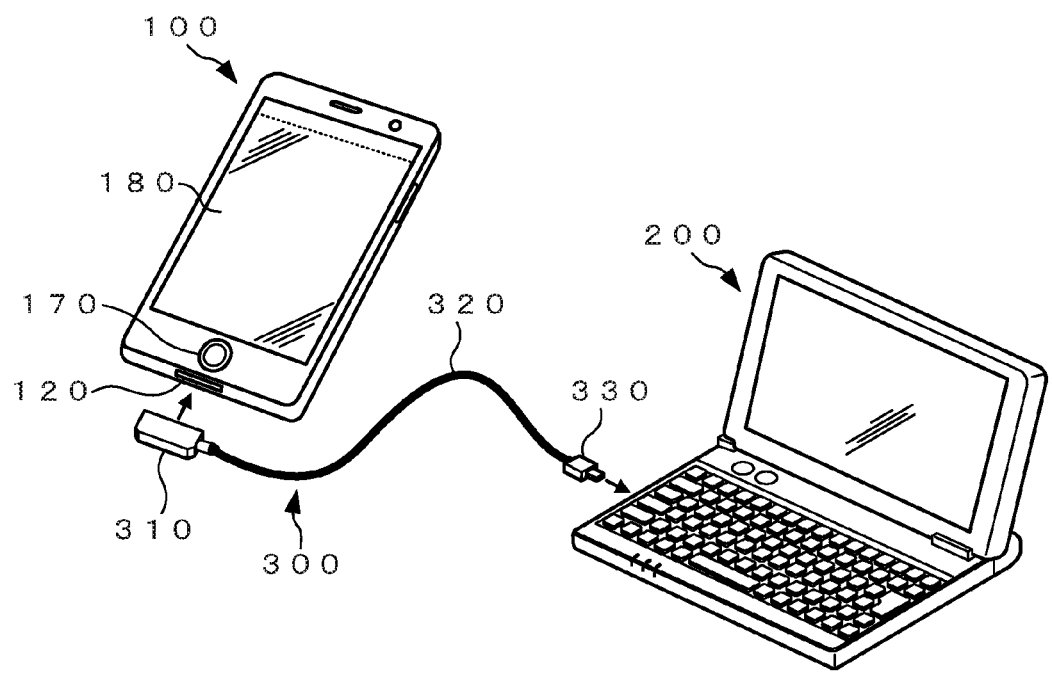
FIG. 8B is a schematic perspective view showing another application example of the electronic device according to the present invention.

FIG. 8A and FIG. 8B are schematic perspective views showing examples of application of the electronic device according to the present invention.

The present invention can be applied to an electronic device 100 such as a smartphone or tablet terminal, as depicted in FIG. 8A and FIG. 8B. That is, electronic devices 100 commercially available in recent years such as smartphones or table terminals often include a magnetic sensor as a standard. This type of electronic device 100 is generally connected via a connection cable 300 to another electronic device such as a charger, a power-feeding power supply adaptor, or a personal computer. Here, in a case where a connection cable 300 including a magnetic connector 310 is applied as a connection cable for this electronic device 100, in a state where a magnetic connector 310 has been connected to a connector connection section 120 provided in the housing, a magnetic field generated from a magnet provided in the magnetic connector 310 may affects a magnetic sensor 110 provided in the electronic device 100, whereby a correct azimuth cannot be detected. However, by the present invention being applied to this electronic device 100, operations and effects equivalent to those of the above-described embodiments can be acquired.

In FIG. 8A and FIG. 8B, a smartphone and a tablet terminal are depicted each as an example of the electronic device 100 to which the present invention can be applied. However, the present invention is not limited thereto and can be applied to any electronic device as long as it includes at least the magnetic sensor 110 and is connected to the external device 200 such as a charger or another electronic device via the connection cable 300 including the magnetic connector 310. For example, the present invention can be applied to a GPS logger, a digital camera, a navigation system, and a wearable terminal rapidly and widely spread in recent years.

Also, the connection cable 300 depicted in FIG. 8A and FIG. 8B has the magnetic connector 310 provided at one end side to be connected to the connector connection section 120 of the electronic device 100, and the connection terminal 330 meeting a specific standard such as USB and provided at the other end side to be connected to the external device 200. However, the present invention is not limited thereto. For example, the connection cable 300 may be integrally connected to the external device 200. Note that, in FIG. 8A, reference numeral 210 denotes a receptacle for commercial alternating-current power supply to which the external device 200 such as a charger or a power-feeding power supply adaptor is connected.

While the present invention has been described with reference to the preferred embodiments, it is intended that the invention be not limited by any of the details of the description therein but includes all the embodiments which fall within the scope of the appended claims.

What is claimed is:

1. An electronic device comprising:
  a magnetic sensor which detects a magnetic field around the electronic device;
  a connector connection section to connect to a magnetic connector including a magnet which is positioned on one end side of a connection cable; and
  a CPU,
  wherein the CPU controls to stop the magnetic sensor from detecting the magnetic field around the electronic device when it is judged that the connector connection section is connected to the magnetic connector.

2. The electronic device according to claim 1, wherein the CPU detects a predetermined voltage supplied via the connection cable, and judges whether the connector connection section and the magnetic connector have been connected to each other, based on a detection result of the predetermined voltage.

3. The electronic device according to claim 1, further comprising:
  a switch section which operates when the connector connection section and the magnetic connector are physically connected to each other, and detects a status of physical connection between the connector connection section and the magnetic connector,
  wherein the CPU detects a predetermined voltage supplied via the connection cable and a connection status of the switch section, and judges whether the connector connection section and the magnetic connector have been connected to each other, based on a detection result of the predetermined voltage and the connection status of the switch section.

4. The electronic device according to claim 3, wherein an external device is connectable to the other end side of the connection cable,
  wherein the predetermined voltage is a voltage supplied from the external device, and
  wherein the CPU judges that the connector connection section and the magnetic connector have been physically connected to each other but the external device has not been connected to the other end side of the connection cable or that the external device has been connected to the other end side of the connection cable but the external device is in an OFF state, and gives a notification regarding a judgment result, when the connector connection section and the magnetic connector are detected to have been physically connected to each other by the switch section and the predetermined voltage has not been detected.

5. The electronic device according to claim 2, further comprising:
  a secondary battery,
  wherein the CPU detects, as the predetermined voltage, a charging voltage supplied from an external device via the connection cable to charge the secondary battery.

6. The electronic device according to claim 2, further comprising:

an interface section which is used for transmitting and receiving predetermined data to and from an external device, wherein the CPU detects a supply voltage superimposed on the data as the predetermined voltage when the predetermined data is transmitted or received via the connection cable.

7. The electronic device according to claim 1, wherein the CPU stops the magnetic sensor from detecting the magnetic field around the electronic device by cutting a driving electric power that is supplied to the magnetic sensor or controlling the magnetic sensor to enter a sleep mode.

8. A magnetic sensor control method for an electronic device equipped with a magnetic sensor which detects a magnetic field around the electronic device and a connector connection section to connect to a magnetic connector including a magnet which is positioned on one end side of a connection cable, the method comprising:

judging whether the connector connection section is connected to the magnetic connector; and controlling to stop the magnetic sensor from detecting the magnetic field around the electronic device when it is judged that the connector connection section is connected to the magnetic connector.

9. The control method according to claim 8, further comprising:

detecting a predetermined voltage supplied via the connection cable, wherein the judging whether the connector connection section is connected to the magnetic connector is based on a detection result of the predetermined voltage.

10. The control method according to claim 8, wherein the electronic device has a switch section which operates when the connector connection section and the magnetic connector are physically connected to each other, and detects a status of physical connection between the connector connection section and the magnetic connector, wherein the method further comprises detecting a predetermined voltage supplied via the connection cable and a connection status of the switch section, and wherein the judging whether the connector connection section is connected to the magnetic connector is based on a detection result of the predetermined voltage and the connection status of the switch section.

11. The control method according to claim 10, wherein an external device is connectable to the other end side of the connection cable, wherein the predetermined voltage is a voltage supplied from the external device, and wherein the method further comprises making a judgment that the connector connection section and the magnetic connector have been physically connected to each other but the external device has not been connected to the other end side of the connection cable or that the external device has been connected to the other end side of the connection cable but the external device is in an OFF state, and giving a notification regarding the judgment, when the connector connection section and the magnetic connector are detected to have been physically connected to each other and the predetermined voltage has not been detected.

12. The control method according to claim 9, wherein the electronic device has a secondary battery, and wherein a charging voltage supplied from an external device via the connection cable to charge the secondary battery is detected as the predetermined voltage.

13. The control method according to claim 9, wherein the electronic device has an interface section which is used for transmitting and receiving predetermined data to and from an external device, and wherein a supply voltage superimposed on the data is detected as the predetermined voltage when the predetermined data is transmitted or received via the connection cable.

14. The control method according to claim 8, wherein the controlling to stop the magnetic sensor from detecting the magnetic field around the electronic device comprises cutting a driving electric power that is supplied to the magnetic sensor or controlling the magnetic sensor to enter a sleep mode.

15. A non-transitory computer-readable storage medium having stored thereon a program that is executable by a CPU of an electronic device equipped with a magnetic sensor which detects a magnetic field around the electronic device, a connector connection section to connect to a magnetic connector including a magnet which is positioned on one end side of a connection cable, and the CPU, the program, when executed by the CPU, causing the CPU to perform operations comprising:

controlling to stop the magnetic sensor from detecting the magnetic field around the electronic device when it is judged that the connector connection section is connected to the magnetic connector.

16. The non-transitory computer-readable storage medium according to claim 15, wherein the program further causes the CPU to perform operation comprising:

detecting a predetermined voltage supplied via the connection cable, and judging whether the connector connection section is connected to the magnetic connector based on a detection result of the predetermined voltage.

17. The non-transitory computer-readable storage medium according to claim 15, wherein the electronic device has a switch section which operates when the connector connection section and the magnetic connector are physically connected to each other, and detects a status of physical connection between the connector connection section and the magnetic connector, and wherein the program further causes the CPU to perform operations comprising:

detecting a predetermined voltage supplied via the connection cable and a connection status of the switch section, and judging whether the connector connection section is connected to the magnetic connector based on a detection result of the predetermined voltage and the connection status of the switch section.

18. The non-transitory computer-readable storage medium according to claim 17, wherein an external device is connectable to the other end side of the connection cable, wherein the predetermined voltage is a voltage supplied from the external device, and wherein the program further causes the CPU to perform operations comprising making a judgment that the connector connection section and the magnetic connector have been physically connected to each other but the external device has not been connected to the other end side of the connection cable or that the external device has been connected to the other end side of the connection cable but the external device is in an OFF state, and giving a notification regarding the judgment, when the connector connection section and the magnetic connector are detected to have been physically connected to each other and the predetermined voltage has not been detected.

19. The non-transitory computer-readable storage medium according to claim 16, wherein the electronic device has an interface section which is used for transmitting and receiving predetermined data to and from an external device, and wherein a supply voltage superimposed on the data is detected as the predetermined voltage when the predetermined data is transmitted or received via the connection cable.

20. The non-transitory computer-readable storage medium according to claim 15, wherein the controlling to stop the magnetic sensor from detecting the magnetic field around the electronic device comprises cutting a driving electric power that is supplied to the magnetic sensor or controlling the magnetic sensor to enter a sleep mode.

* * * * *